United States Patent
Cheng

(10) Patent No.: US 11,705,895 B1
(45) Date of Patent: Jul. 18, 2023

(54) VOLTAGE CONTROLLED OSCILLATOR POWER SUPPLY NOISE REJECTION

(71) Applicant: Ambarella International LP, Santa Clara, CA (US)

(72) Inventor: Yueh Chun Cheng, Cupertino, CA (US)

(73) Assignee: Ambarella International LP, Santa Clara, CA (US)

( * ) Notice: Subject to any disclaimer, the term of this patent is extended or adjusted under 35 U.S.C. 154(b) by 0 days.

(21) Appl. No.: 17/834,897

(22) Filed: Jun. 7, 2022

(51) Int. Cl.
| | |
|---|---|
| *H03K 5/1252* | (2006.01) |
| *G05F 1/56* | (2006.01) |
| *H03K 3/03* | (2006.01) |
| *H03K 3/011* | (2006.01) |
| *H03L 1/00* | (2006.01) |

(52) U.S. Cl.
CPC ........... *H03K 5/1252* (2013.01); *G05F 1/56* (2013.01); *H03K 3/011* (2013.01); *H03K 3/0315* (2013.01); *H03K 3/0322* (2013.01); *H03L 1/00* (2013.01)

(58) Field of Classification Search
CPC ........ H03L 1/00; H03K 3/011; H03K 3/0322; H03K 5/1252; H03K 3/0315; G05F 1/56
USPC ..................................... 331/34, 57; 327/543
See application file for complete search history.

(56) References Cited

U.S. PATENT DOCUMENTS

| | | | |
|---|---|---|---|
| 11,590,344 B2 * | 2/2023 | Weerakoon | .......... A61N 1/0551 |
| 2013/0057246 A1 * | 3/2013 | Satoh | ........................ G05F 3/30 |
| | | | 323/313 |
| 2021/0091784 A1 * | 3/2021 | Tseng | ..................... H03L 7/099 |

* cited by examiner

*Primary Examiner* — Arnold M Kinkead
(74) *Attorney, Agent, or Firm* — Christopher P. Maiorana, PC

(57) ABSTRACT

An apparatus comprises a first circuit, a second circuit, a first transistor, a second transistor, a third transistor, a first programmable resistance, and a second programmable resistance. The first circuit may be configured to generate a reference signal and a bias signal in response to a supply voltage and a first input signal. The first circuit generally provides supply noise rejection to variations in the supply voltage. The second circuit may be connected to the first circuit and a ring oscillator. The first transistor may be connected to the first circuit and configured to set a first reference current of the first circuit based on the first input signal and the first programmable resistance. The second transistor may be connected in parallel with the first transistor. The second transistor is generally diode-connected. The third transistor may be connected to the first circuit and configured to set a second reference current of the first circuit based on the first input signal and the second programmable resistance. The first circuit generally forms a current mirror with the second circuit. The second circuit may be configured to provide a programmable current ratio for the current mirror based on a value of a second input signal.

20 Claims, 15 Drawing Sheets

VOLTAGE CONTROLLED OSCILLATOR POWER SUPPLY NOISE REJECTION

FIELD OF THE INVENTION

The invention relates to integrated circuits generally and, more particularly, to a method and/or apparatus for implementing voltage controlled oscillator power supply noise rejection.

BACKGROUND

Phase-locked loops (PLLs) are used to generate clock signals that control many operations in integrated circuits. In many applications, the PLLs need to cover a wide range of frequencies. For example, an operating frequency of a double data rate (DDR) memory device can range from 4 GHz to 8 GHz.

In order to cover the wide range of frequencies and account for variations due to process, voltage, and temperature (PVT), a voltage controlled oscillator (VCO) of the PLLs needs a large VCO gain (Kvco) and a large control voltage range. Variations in power supply voltage can result in jitter. A low drop out (LDO) regulator can be used to minimize power supply voltage variations. However, the LDO regulator has disadvantages such as increased cost, because an extra power supply and additional chip area are needed, and increased power consumption, because the extra power supply needs a voltage that is higher than an operating voltage of the VCO.

It would be desirable to implement voltage controlled oscillator power supply noise rejection that avoids implementing a LDO regulator.

SUMMARY

The invention concerns an apparatus comprising a first circuit, a second circuit, a first transistor, a second transistor, a third transistor, a first programmable resistance, and a second programmable resistance. The first circuit may be configured to generate a reference signal and a bias signal in response to a supply voltage and a first input signal. The first circuit generally provides supply noise rejection to variations in the supply voltage. The second circuit may be connected to the first circuit and a ring oscillator. The first transistor may be connected to the first circuit and configured to set a first reference current of the first circuit based on the first input signal and the first programmable resistance. The second transistor may be connected in parallel with the first transistor. The second transistor is generally diode-connected. The third transistor may be connected to the first circuit and configured to set a second reference current of the first circuit based on the first input signal and the second programmable resistance. The first circuit generally forms a current mirror with the second circuit. The second circuit may be configured to provide a programmable current ratio for the current mirror based on a value of a second input signal.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing voltage controlled oscillator power supply noise rejection that may (i) utilize operational transconductance amplifier biasing, (ii) be implemented without a low drop out (LDO) regulator, (iii) eliminate LDO static power consumption at power down, (iv) consume half the power of a VCO implementing an LDO regulator, (v) provide reduced cost, and/or (vi) be implemented as one or more integrated circuits.

Figure 1:
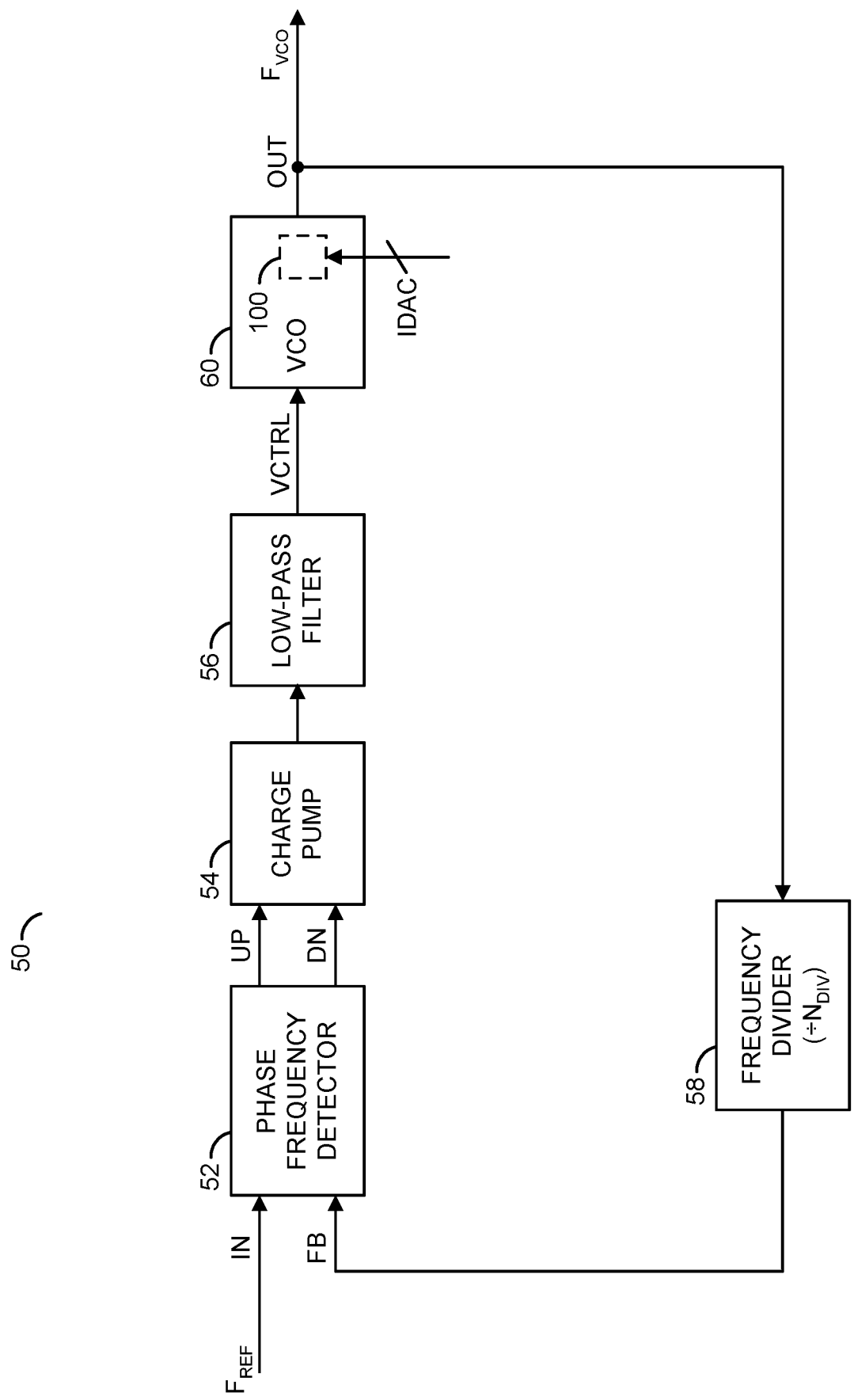
FIG. 1 is a diagram illustrating a phased locked loop circuit in accordance with an embodiment of the invention.

Referring to FIG. 1, a diagram is shown illustrating a phase-locked loop circuit in accordance with an embodiment of the invention. In an example, a circuit 50 may implement a phase-locked loop (PLL) circuit in accordance with an embodiment of the invention. In an example, the circuit 50 may be utilized to implement a frequency synthesizer (or generator) circuit. In an example, the circuit 50 may have an input that may receive an input signal (e.g., IN), and an output that may present an output signal (e.g., OUT). In an example, the input signal IN may comprise a first (or reference) frequency (e.g., $F_{REF}$) and the output signal OUT may comprise a second (or VCO) frequency (e.g., $F_{VCO}$).

In an example, the reference frequency may be derived from a precision frequency source such as a crystal (XTAL) oscillator. In an example, the crystal oscillator may be external to an integrated circuit embodying the circuit 50. In an example, a clock signal from the crystal oscillator may be applied to a pin of the integrated circuit and communicated to the input of the circuit 50. In another example, the clock signal from the crystal oscillator may be presented to an input of a pre-scaler circuit (not shown). The pre-scaler circuit may be configured to divide a frequency of the crystal (or external) oscillator to a desired input frequency $F_{REF}$ of the circuit 50. In an example, the pre-scaler circuit may be programmable to allow operation of the circuit 50 with a variety of source clock frequencies.

In an example, the circuit 50 may be configured to generate the frequency $F_{VCO}$ of the output signal OUT as a multiple (e.g., either integer or fraction) of the frequency $F_{REF}$ of the input signal IN (e.g., $F_{VCO}=N\times F_{REF}$). In various embodiments, the frequency and/or phase of the output signal OUT may be locked to the frequency and/or phase of the input signal IN. In an example, one or more clock signals of the integrated circuit embodying the circuit 50 may be derived from the signal OUT. In an example, the signal OUT may be presented to an input of a post-scaler circuit (not shown). The post-scaler circuit may be configured to generate the one or more clock signals by dividing the frequency $F_{VCO}$ of the signal OUT to obtain respective clock frequencies of the one or more clock signals. In an example, the post-scaler circuit may be programmable to allow operation of the circuit 50 in a variety of applications.

In an example, the circuit 50 may comprise a block (or circuit) 52, a block (or circuit) 54, a block (or circuit) 56, a block (or circuit) 58, a block (or circuit) 60, and a block (or circuit) 100. In an example, the block 52 may be implemented as a phase frequency detector (PFD) circuit. In another example, the block 52 may be implemented as a phase detector (PD) circuit. The block 54 may be implemented as a charge pump (CP) circuit. The block 56 may be implemented as a loop filter. In an example, the block 56 may be implemented as a low-pass filter. The block 58 may be implemented as a frequency divider. In an example, the block 58 may be implemented as an integer-N architecture divider. In another example, the block 58 may be implemented as a fractional-N architecture divider. The blocks 52, 54, 56, and 58 may be implemented using conventional techniques.

In various embodiments, the block 60 may be implemented as a voltage-controlled oscillator (VCO). In various embodiments, the block 60 may be implemented as a ring VCO. In various embodiments, the block 60 may include the block 100. In various embodiments, the block 100 may be configured to implement a ring VCO utilizing a technique of power supply noise rejection in accordance with an embodiment of the invention.

In an example, the block 52 is illustrated implementing a phase frequency detector (PFD). The PFD 52 may have a first input that may receive the signal IN, a second input that may receive a signal FB, a first output that may present a signal UP, and a second output that may present a signal DN. The signals UP and DN may implement control signals. The signal FB may be a divided version of the signal OUT. The signal UP, when asserted, may indicate the frequency $F_{VCO}$ of the signal OUT needs to be increased. The signal DN, when asserted, may indicate the frequency $F_{VCO}$ of the signal OUT needs to be decreased. In an example, the PFD 52 may implement an edge sensitive circuit that measures an arrival time of an edge of the signal IN relative to an arrival time of an edge of the signal FB.

In an example, the signal UP may be asserted (e.g., a digital HIGH, or 1) when the edge of the signal IN arrives before the edge of the signal FB. Likewise, the signal DN may be asserted (e.g., a digital HIGH, or 1) when the edge of the signal FB arrives before the edge of the signal IN. In an example, the PFD 52 is generally sensitive to not only a phase difference, but also a frequency difference. When the signal FB is faster than the signal IN (e.g., a frequency $F_{FB}$ of the signal FB is higher than the frequency $F_{REF}$ of the signal IN), edges of the signal FB always arrive earlier than edges of the signal IN, and the signal DN may be asserted to request a decrease in the frequency $F_{VCO}$ of the signal OUT. This functionality generally allows the PFD 52 to function as a frequency detector.

The charge pump 54 is generally driven (controlled) by the PFD 52. In an example, the charge pump 54 may have a first input that may receive the signal UP and a second input that may receive the signal DN. The signals UP and DN may be used to control the charge pump 54 when the charge pump 54 is enabled. In an example, the charge pump 54 may comprise a first current source controlled by the signal UP and a second current source controlled by the signal DN. An output of the charge pump 54 may be coupled to an input of the loop filter 56. In an example, the first current source may be configured to dump charge into an integrating capacitor of the loop filter 56 in response to the signal UP and the second current source may be configured to remove (sink) current from the integrating capacitor of the loop filter 56 in response to the signals DN.

The loop filter 56 may have an output that may present a signal (e.g., VCTRL) comprising a voltage level related to the charge level of the integrating capacitor. If neither the signal UP nor the signal DN is asserted, the output of the charge pump 54 neither dumps charge into nor removes charge from the integrating capacitor of the loop filter 56, which generally happens in steady state. However, any leakage or mismatch between the up/down currents may cause ripples on the output and, therefore, reference spurs to be generated.

In an example, the loop filter 56 may be implemented as a low pass filter. The loop filter 56 is generally configured to reduce ripples on the output of the charge pump 54 and, therefore, reduce reference spurs that may be generated. The loop filter 56 may have an output that may present the signal VCTRL. The signal VCTRL may implement a control voltage signal. In an example (e.g., an operating mode), the loop filter 56 may generate the signal VCTRL in response to the signal received from the charge pump 54. In another example (e.g., a calibration mode), the loop filter 56 may generate the signal VCTRL in response to a reference voltage signal (e.g., VREF).

In an example, the PFD 52, the charge pump 54, the loop filter 56, and the VCO 60 are generally implemented in a first power supply domain having an analog supply voltage (e.g., AVDD) and the block 58 may be implemented in a second power supply domain having a digital supply voltage (e.g., DVDD). In various embodiments, the analog supply voltage AVDD and the digital supply voltage DVDD may be different. In an example, the analog supply voltage AVDD may be implemented as 1.2 Volts. In an example, the digital supply voltage DVDD may be implemented as 0.75 Volts. In embodiments where the analog supply voltage AVDD and the digital supply voltage DVDD are different, the PFD 52 may be configured to level shift the signals IN and FB to the level of the analog supply voltage AVDD.

The block 58 may be implemented as a frequency divider. The block 58 may have an input that may receive the signal OUT and an output that may present the signal FB. In an example, the block 58 may be configured with a divider value (e.g. $N_{DIV}$) corresponding to a desired difference between the frequency $F_{REF}$ of the signal IN and the frequency $F_{VCO}$ of the signal OUT (e.g., $F_{VCO}=F_{REF}*N_{DIV}$). In an example, the block 58 may be programmable to allow operation of the circuit 50 in a variety of applications. In an example, an operating frequency of a double data rate (DDR) memory device may range from 4 GHz to 8 GHz. In an example where the signal IN has a frequency of about 24 MHz, the block 58 may be configured with the divider value $N_{DIV}$ having a range from about 165 to about 334.

The voltage-controlled oscillator (VCO) 60 may have a first input that may receive the signal VCTRL, a second input that may receive a signal (e.g., IDAC), and an output that may present the signal OUT. In various embodiments, the signal IDAC may be implemented as a multi-bit digital control signal (e.g., IDAC<n:0>). In an example, the signal IDAC my be implemented as a 7-bit digital control signal (e.g., IDAC<6:0>). However, other numbers of bits may be implemented to meet design criteria of a particular implementation. In an example, the number of bits may be selected to ensure a sufficient number of overlapped tuning sub-bands to enable a voltage range of the signal VCTRL to compensate for frequency variation due to temperature variation. The VCO 60 is generally configured to generate the signal OUT in response to the signal VCTRL, the signal IDAC, and a supply voltage VDD. In various embodiments, the supply voltage VDD may be implemented as the analog supply voltage AVDD.

In various embodiments, the VCO 60 comprises the block 100. The block 100 may be configured to implement a ring VCO circuit utilizing a technique of operational transconductance amplifier biasing in accordance with an embodiment of the invention. The block 100 is generally configured to generate the signal OUT in response to the signal VCTRL, the signal IDAC, and the supply voltage VDD. In various embodiments, the frequency $F_{VCO}$ of the signal OUT is generally determined in response to the signal VCTRL and the signal IDAC. In an example, the block 100 may be configured to select a frequency tuning sub-band that covers a desired operating frequency range in response to the signal IDAC. In an example, the signal IDAC may be generated using a process described in U.S. application Ser. No. 17/683,613, filed Mar. 1, 2022, which is herein incorporated by reference in its entirety.

Figure 2:
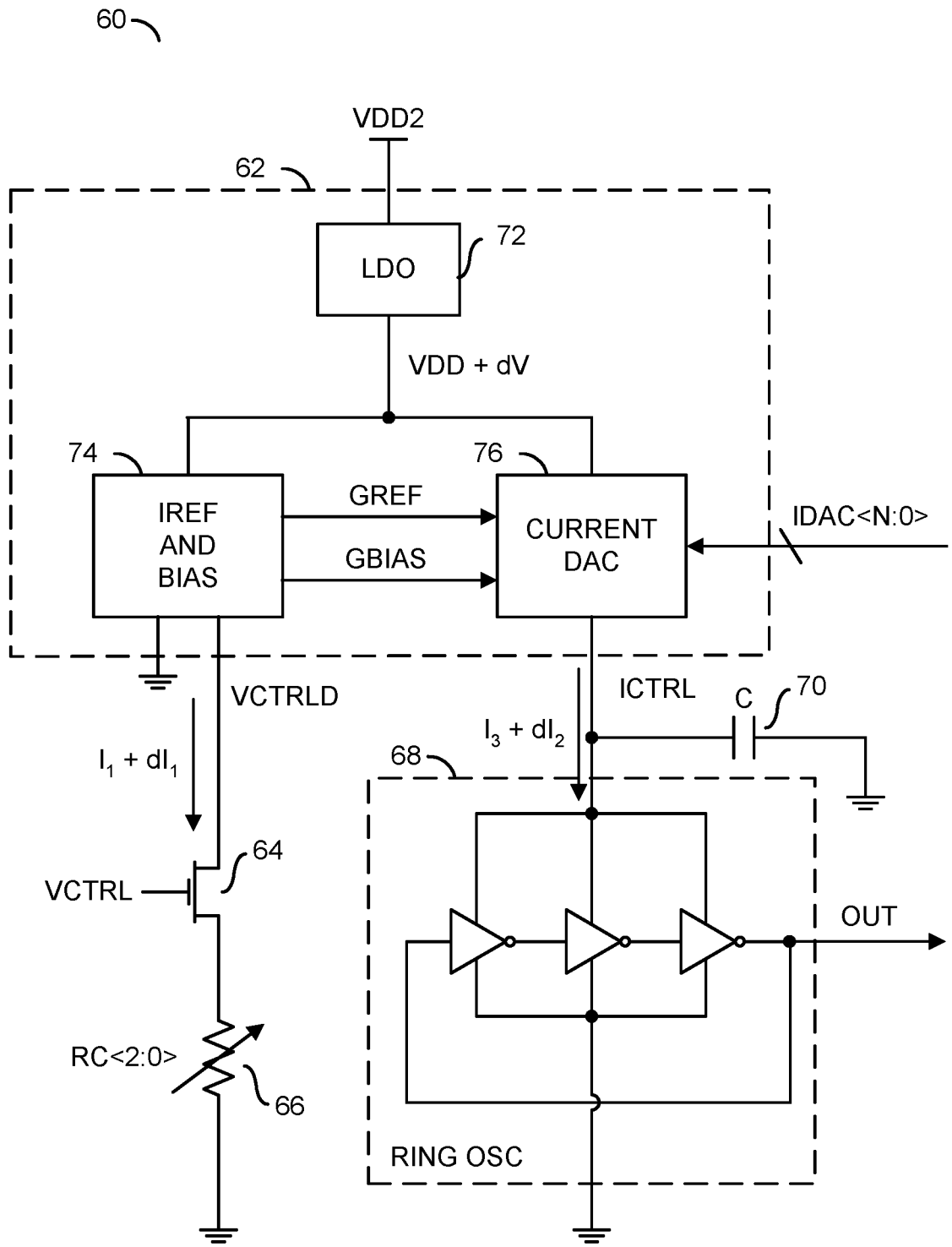
FIG. 2 is a diagram illustrating a current-biased voltage controlled oscillator circuit with a low drop out regulator for power supply noise rejection.

Referring to FIG. 2, a diagram is shown illustrating a current-biased voltage controlled oscillator implementing a low drop out (LDO) regulator for good power supply rejection. In an example, the VCO 60 may comprise the circuit 62, a transistor 64, a programmable resistance 66, and a ring oscillator 68. In an example, the transistor 64 may be implemented as an n-channel metal-oxide-semiconductor (NMOS) field effect transistor (FET). In an example, the programmable resistance 66 may be configured to be controlled by a three-bit digital signal (e.g., RC<2:0>). In an example, the ring oscillator 68 may comprise an odd number of inverter circuits connected in a ring. In an example, the ring oscillator 68 may comprise three inverter circuits connected in a ring. A bypass capacitor 70 may be connected between a current control terminal of the ring oscillator 68 and a circuit ground potential. The bypass capacitor 70 generally helps reduce noise on a current signal (e.g., ICTRL) presented to the current control terminal of the ring oscillator 68.

The circuit 62 may comprise a block (or circuit) 72, a block (or circuit) 74, and a block (or circuit) 76. The block 72 may be implemented as a regulator circuit. In an example, the block 72 may be implemented as a low drop out (LDO) regulator. The block 74 may be implemented as a reference current and bias signal generating circuit. The block 76 may be implemented as a digitally programmable current source.

In an example, the circuit 76 may be implemented as an n-bit current-steering digital-to-analog converter. In an example, the circuit 76 may be implemented as a 7-bit current-steering digital-to-analog converter. In an example, the circuit 62 may be implemented similarly to a circuit described in U.S. application Ser. No. 17/683,613, filed Mar. 1, 2022, which is herein incorporated by reference in its entirety.

In an example, a voltage supply VDD2 may be connected to an input of the regulator circuit 72. An output of the regulator circuit 72 may present a regulated supply voltage VDD. The regulator circuit 72 is generally configured to generate the regulated supply voltage VDD from the supply voltage VDD2. In various embodiments, the regulated supply voltage VDD has a level similar to the analog supply voltage AVDD. In an example, the supply voltage VDD2 may be implemented as twice the regulated supply voltage VDD (e.g., VDD2=2.4V for VDD=1.2V). The output of the regulator circuit 72 may be connected to a voltage supply input of the circuit 74 and a voltage supply input of the circuit 76. A first output of the circuit 74 may present a signal (e.g., GREF). A second output of the circuit 74 may present a signal (e.g., GBIAS). A third output of the circuit 74 may be connected to a drain terminal of the transistor 62. A source terminal of the transistor 62 may be connected to a first terminal of the programmable resistance 66. A second terminal of the programmable resistance 66 may be connected to a circuit ground potential. A second supply terminal of the circuit 74 may also be connected to the circuit ground potential. The signal VCTRL may be presented to a gate terminal of the transistor 62. The signals GREF and GBIAS may be generated by the circuit 74 in response to the supply voltage VDD based on the signal VCTRL and the signal RC<2:0>.

The circuit 74 and the circuit 76 are generally connected to form a current mirror. The circuit 76 may have a first input that may receive the signal GREF, a second input that may receive the signal GBIAS, a third input that may receive the signal IDAC, and an output that may present the current signal ICTRL. The circuit 76 is generally configured to generate the current signal ICTRL in response to the regulated supply voltage VDD, the signal GREF, the signal GBIAS, and the signal IDAC. In an example, the signal IDAC may be implemented as an n-bit digital control signal (e.g., IDAC<n:0>). In an example embodiment, the signal IDAC may be implemented as a 7-bit digital control signal (e.g., IDAC<6:0>). The circuit 76 is generally configured to generate the current signal ICTRL comprising a flexible current ratio 1:N following a control voltage current (e.g., VCTRLD) generated by the circuit 74 and communicated to the circuit 76 by the signal GREF and the signal GBIAS. In an example, the current ICTRL=N times the control voltage current VCTRLD. In an example, the circuit 76 may be configured to provide a maximum ratio of 3× between the current ICTRL and the control voltage current VCTRLD.

In general, use of the LDO regulator 72 to provide power supply rejection comes at a cost such as increased cost, because an extra power supply and additional chip area are needed, and increased power consumption, because the extra power supply needs a voltage that is higher than an operating voltage of the VCO. However, if the LDO regulator 72 is omitted, a variation (e.g., dv) in the supply voltage VDD may result in frequency change and jitter. In a VCO using the current-biased circuit 62 without the LDO regulator 72, when the supply voltage VDD changes by dV (e.g., VDD becomes VDD+dV), a change (e.g., $dI_1$) in a magnitude $I_1$ of the control voltage current VCTRLD occurs. When the signal IDAC=3 and the supply voltage VDD changes by dv (e.g., VDD becomes VDD+dV), a change (e.g., $dI_2$) in a magnitude $I_3$ of the current signal ICTRL does not track the change $dI_1$ in the control voltage current VCTRLD (e.g., $dI_2 \neq 3dI_1$), which may result in frequency change and jitter. In particular, $dI_2$ may be greater than or less than $dI_1$, depending on a difference between a voltage level of the control voltage current VCTRLD and a voltage level of the current signal ICTRL. Variations in the currents result in frequency change and jitter.

Figure 3:
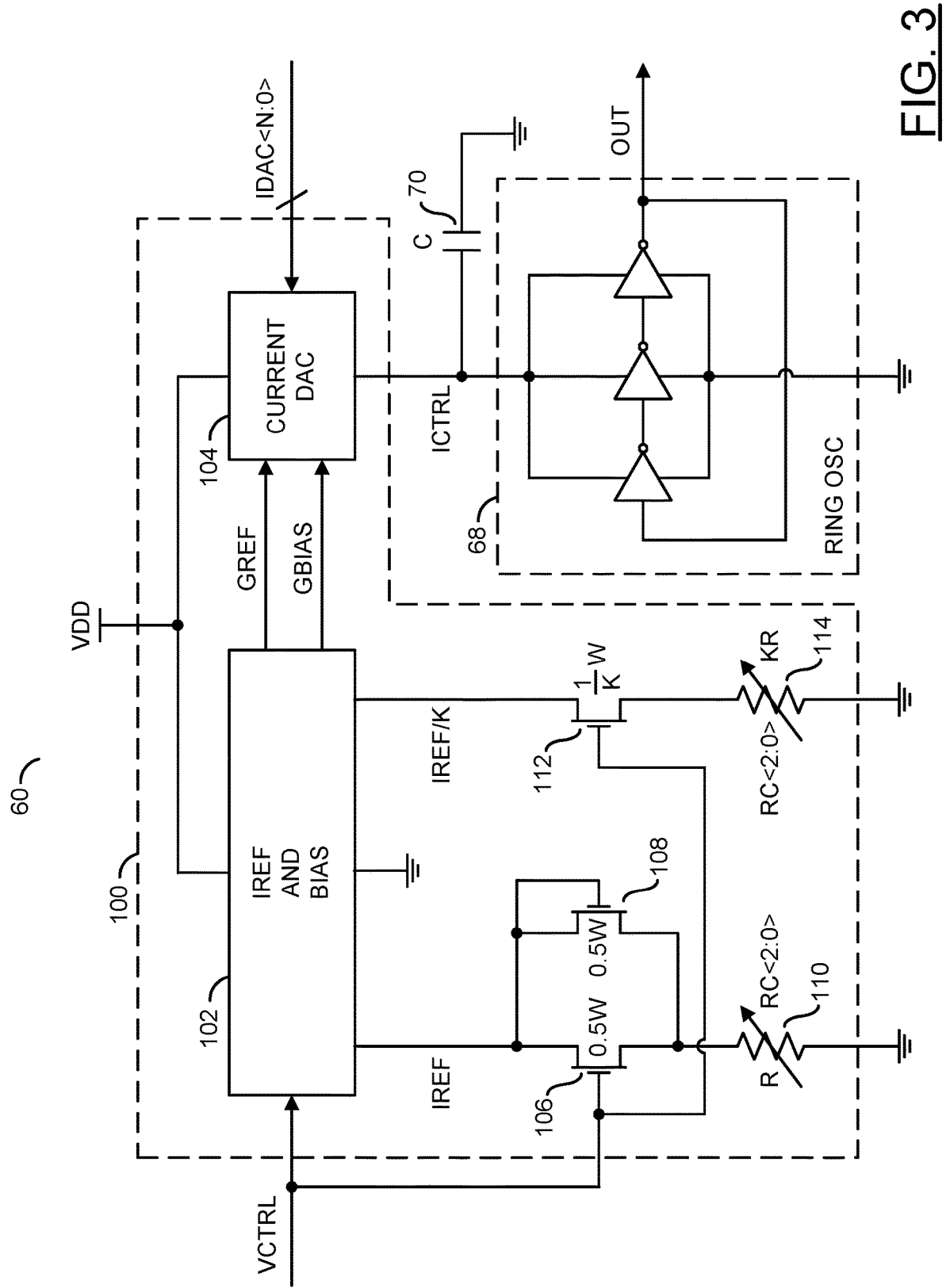
FIG. 3 is a diagram illustrating a voltage controlled oscillator in accordance with an embodiment of the invention.

Referring to FIG. 3, a diagram is shown illustrating a voltage controlled oscillator in accordance with an embodiment of the invention. In an example, the VCO 60 may be implemented using an operational transconductance amplifier (OTA) biasing scheme in accordance with an embodiment of the invention. In an example, the VCO 60 may comprise the circuit 100 and the ring oscillator 68. The circuit 100 may comprise a block (or circuit) 102, a block (or circuit) 104, a transistor 106, a transistor 108, a first programmable resistance 110, a transistor 112, and a second programmable resistance 114. The block 102 may be implemented as a reference current and bias signal generating circuit. The block 104 may be implemented as a digitally programmable current source. In an example, the circuit 104 may be implemented as an n-bit current-steering digital-to-analog converter. In an example, the circuit 104 may be implemented as a 7-bit current-steering digital-to-analog converter.

In an example, each of the transistors 106, 108, and 112 may be implemented as an n-channel metal-oxide-semiconductor (NMOS) field effect transistor (FET). In an example, the transistors 106, 108, and 112 may be implemented using 4 nm technology. In an example, the first programmable resistance 110 and the second programmable resistance 114 may be configured to be controlled by the three-bit digital signal RC<2:0>. In an example, the ring oscillator 68 may comprise an odd number of inverter circuits connected in a ring. In an example, the ring oscillator 68 may comprise three inverter circuits connected in a ring.

In an example, the transistors 106 and 108 may provide a combined channel width W. In an example, each of the transistors 106 and 108 may be implemented with a respective channel width of 0.5 W. In an example, the transistor 112 may be implemented with a respective channel width that is a fraction (e.g., W/K) of the combined channel width of the transistors 106 and 108. In an example, the first programmable resistance 110 may be configured to provide a maximum resistance R. In an example, the second programmable resistance 114 may be configured to provide a maximum resistance K*R. In general, a ratio of K may be maintained between the second programmable resistance 114 and the first programmable resistance 110 over a range of values (steps) of the three-bit digital signal RC<2:0>.

In an example, the voltage supply VDD may be connected to a first voltage supply terminal of the circuit 102 and a voltage supply terminal of the circuit 104. A first input terminal of the circuit 102 may receive the signal VCTRL. A first output of the circuit 102 may present a signal (e.g., GREF). A second output of the circuit 102 may present a signal (e.g., GBIAS). A third output of the circuit 102 may be connected to a drain terminal of the transistor 106, a drain terminal of the transistor 108, and a gate terminal of the transistor 108. A fourth output of the circuit 102 may be connected to a drain terminal of the transistor 112. A second supply terminal of the circuit 102 may be connected to a circuit ground potential.

A source terminal of the transistor 106 and a source terminal of the transistor 108 may be connected to a first terminal of the first programmable resistance 110. A second terminal of the first programmable resistance 110 may be connected to the circuit ground potential. A source terminal of the transistor 112 may be connected to a first terminal of the second programmable resistance 114. A second terminal of the second programmable resistance 114 may be connected to the circuit ground potential. The signal VCTRL may be presented to a gate terminal of the transistor 106 and a gate terminal of the transistor 112. In an example, the circuit 102, the transistors 106 and 108, and the first programmable resistance 110 may be configured to generate a first control voltage current (e.g., IREF) in response to the supply voltage VDD, the signal VCTRL, and the signal RC<2:0>. In an example, the circuit 102, the transistor 112, and the second programmable resistance 114 may be configured to generate a second control voltage current (e.g., IREF/K) in response to the supply voltage VDD, the signal VCTRL, and the signal RC<2:0>. The signals GREF and GBIAS may be generated by the circuit 102 in response to the supply voltage VDD based on the signal VCTRL and the signal RC<2:0>.

The circuit 102 and the circuit 104 are generally connected to form a current mirror. The circuit 104 may have a first input that may receive the signal GREF, a second input that may receive the signal GBIAS, a third input that may receive the signal IDAC, and an output that may present the current signal ICTRL. The circuit 104 is generally configured to generate the current signal ICTRL in response to the supply voltage VDD, the signal GREF, the signal GBIAS, and the signal IDAC. In an example, the signal IDAC may be implemented as an n-bit digital control signal (e.g., IDAC<n:0>). In an example embodiment, the signal IDAC may be implemented as a 7-bit digital control signal (e.g., IDAC<6:0>). The circuit 104 is generally configured to provide a flexible current ratio based on the signal IDAC. The circuit 104 is generally configured to generate the current signal ICTRL comprising a flexible current ratio 1:N following the first control voltage current IREF generated by the circuit 102 and communicated to the circuit 104 by the signal GREF and the signal GBIAS (e.g., ICTRL=N times the first control voltage current IREF). In an example, the circuit 104 may be configured to provide a maximum ratio of 3× between the current ICTRL and the first control voltage current IREF.

In an example, an output of the circuit 104 may be connected to the control current terminal of the ring oscillator 68. The bypass capacitor 70 may be connected between the output of the circuit 104 and the circuit ground potential. The bypass capacitor 70 generally helps reduce noise on the signal ICTRL. The current ICTRL may be presented from the output of the circuit 104 to the control current terminal of the ring oscillator 68. A second terminal of the ring oscillator 68 may be connected to the circuit ground potential. The ring oscillator 68 is generally configured to generate the signal OUT in response to the signal ICTRL.

Figure 4:
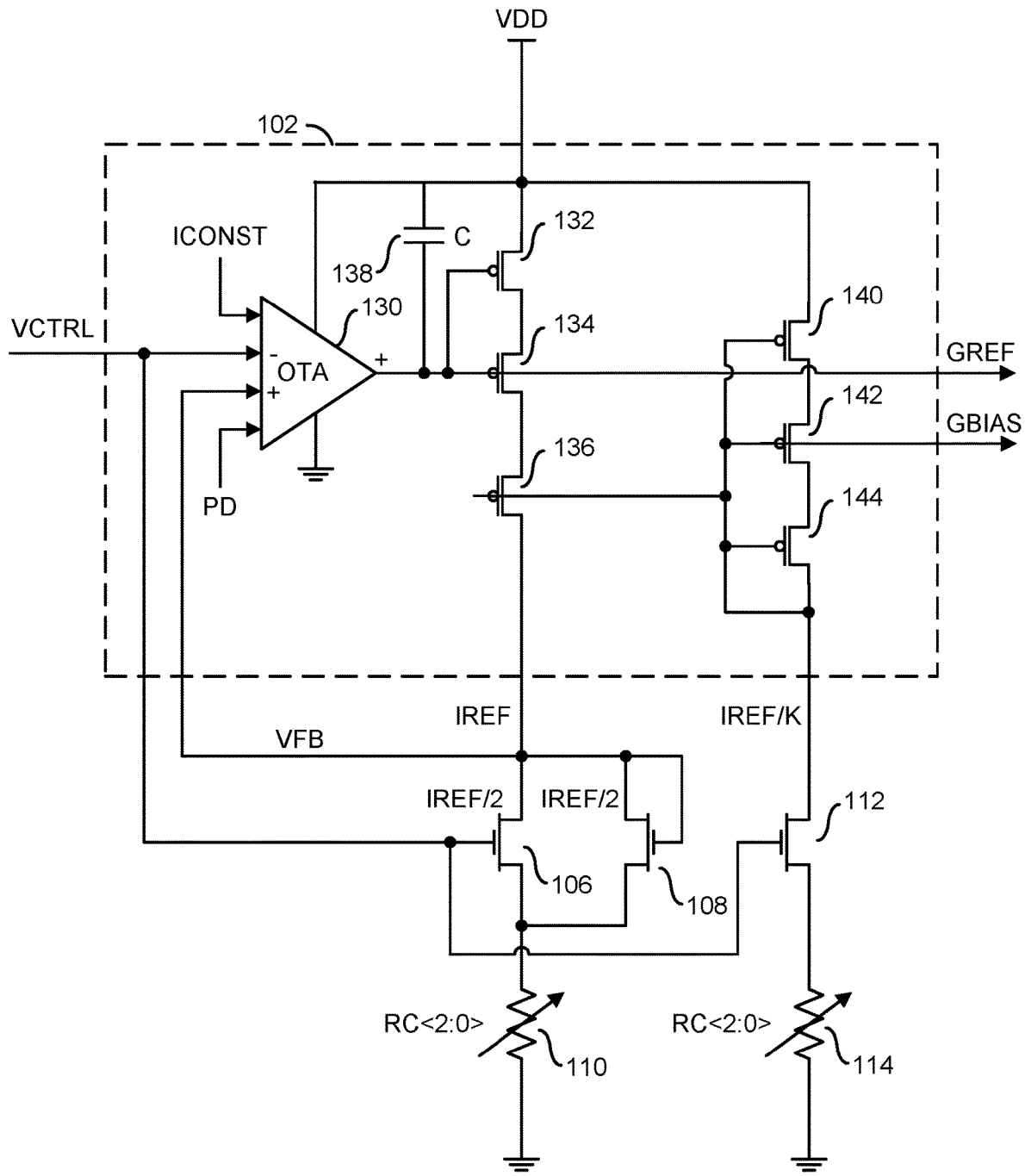
FIG. 4 is a diagram illustrating a current reference and bias voltage generating circuit in accordance with an embodiment of the invention.

Referring to FIG. 4, a diagram is shown illustrating an example implementation of the circuit 102 of FIG. 3. In an example, the circuit 102 may be configured to generate the first control voltage current IREF, the second control voltage current IREF/K, the current mirror signal GREF, and the bias signal GBIAS. In an example, the circuit 102 may comprise a block (or circuit) 130, a transistor 132, a transistor 134, a transistor 140, a transistor 142, a transistor 144. In an example, the circuit 130 may be implemented as an operational transconductance amplifier (OTA). In an example, the circuit 130 may implemented a wide-swing folded cascade operational transconductance amplifier. In various embodiments, the OTA 130 may be implemented having an opamp loop bandwidth that is greater than ten times a loop bandwidth of the PLL 50. In an example, the OTA 130 may be implemented having an opamp loop bandwidth greater than 10 MHz. In an example, the transistor 132, the transistor 134, the transistor 140, the transistor 142, and the transistor 144 may be implemented as one or more p-channel metal-oxide-semiconductor (PMOS) field effect transistors (FETs). In an example, the transistor 132, the transistor 134, the transistor 140, the transistor 142, and the transistor 144 may be implemented using 4 nm technology. The circuit 130 generally comprises a differential amplifier configured to generate an output current in response to a differential input voltage. In an example, the circuit 130 may provide a voltage controlled current source (VCCS).

A first input terminal of the circuit 130 may receive a signal (e.g., ICONST). A second input terminal of the circuit 130 may receive the signal VCTRL. A third input terminal of the circuit 130 may receive a signal (e.g., VFB). A fourth input terminal of the circuit 130 may receive a signal (e.g., PD). The signal ICONST may implement an input bias current. In an example, the signal ICONST may be generated using a bandgap circuit. In an example, the signal ICONST may comprise a current of approximately 15 µA. However, other current magnitudes may be implemented to meet design criteria of a particular application. The signal PD may implement a power down feature. In an example, the circuit 130 may be configured to reduce power consumption when the signal PD is asserted.

In an example, a first power supply terminal of the circuit 130, a source terminal of the transistor 132, and a source terminal of the transistor 140 may be connected to the supply voltage VDD. A drain terminal of the transistor 132 may be connected to a source terminal of the transistor 134. A gate terminal of the transistor 132 may be connected to a gate terminal of the transistor 134 and an output terminal of the circuit 130. The signal GREF may be presented at a node formed by the connection of the output terminal of the circuit 130, the gate terminal of the transistor 132, and the gate terminal of the transistor 134. A drain terminal of the transistor 134 may be connected to a source terminal of the transistor 136. A drain terminal of the transistor 136 may be connected to the drain terminal of the transistor 106, the drain terminal of the transistor 108, and the gate terminal of the transistor 108. In an example, each of the transistors 106 and 108 may be implemented with a respective channel width of 0.5 W, splitting the first control voltage current IREF in half (e.g., IREF/2) between each of the transistors 106 and 108. The signal VFB may be presented at a node formed by the connection of the drain terminal of the transistor 136, the drain terminal of the transistor 106, the drain terminal of the transistor 108, and the gate terminal of the transistor 108. A bypass capacitor 138 may be connected between the output terminal of the OTA 130 and the supply voltage VDD. The bypass capacitor 138 generally makes a first (dominant) pole of the OTA 130 low enough for loop stability. The transistor 108 is generally diode connected to keep a second pole of the OTA 130 far away from the first pole of the OTA 130 for loop stability. The gate-source voltage $V_{gs}$ of the NMOS transistors generally equals the drain-source voltage $V_{ds}$ of the NMOS transistors, thus the drain current $I_d$ does not vary with variation of supply voltage VDD. The voltage GREF generally changes with supply variation to keep the drain current $I_d$ constant.

A drain terminal of the transistor 140 may be connected to a source terminal of the transistor 142. A drain terminal of the transistor 142 may be connected to a source terminal of the transistor 144. A gate terminal of the transistor 140 may be connected to a gate terminal of the transistor 142, a gate terminal of the transistor 136, a gate terminal of the transistor 144, and a drain terminal of the transistor 144. The signal GBIAS may be presented at a node formed by the connection of the gate terminal of the transistor 140, the gate terminal of the transistor 142, the gate terminal of the transistor 136, the gate terminal of the transistor 144, and the drain terminal of the transistor 144. The drain terminal of the transistor 144 may also be connected to the drain terminal of the transistor 112.

Figure 5:
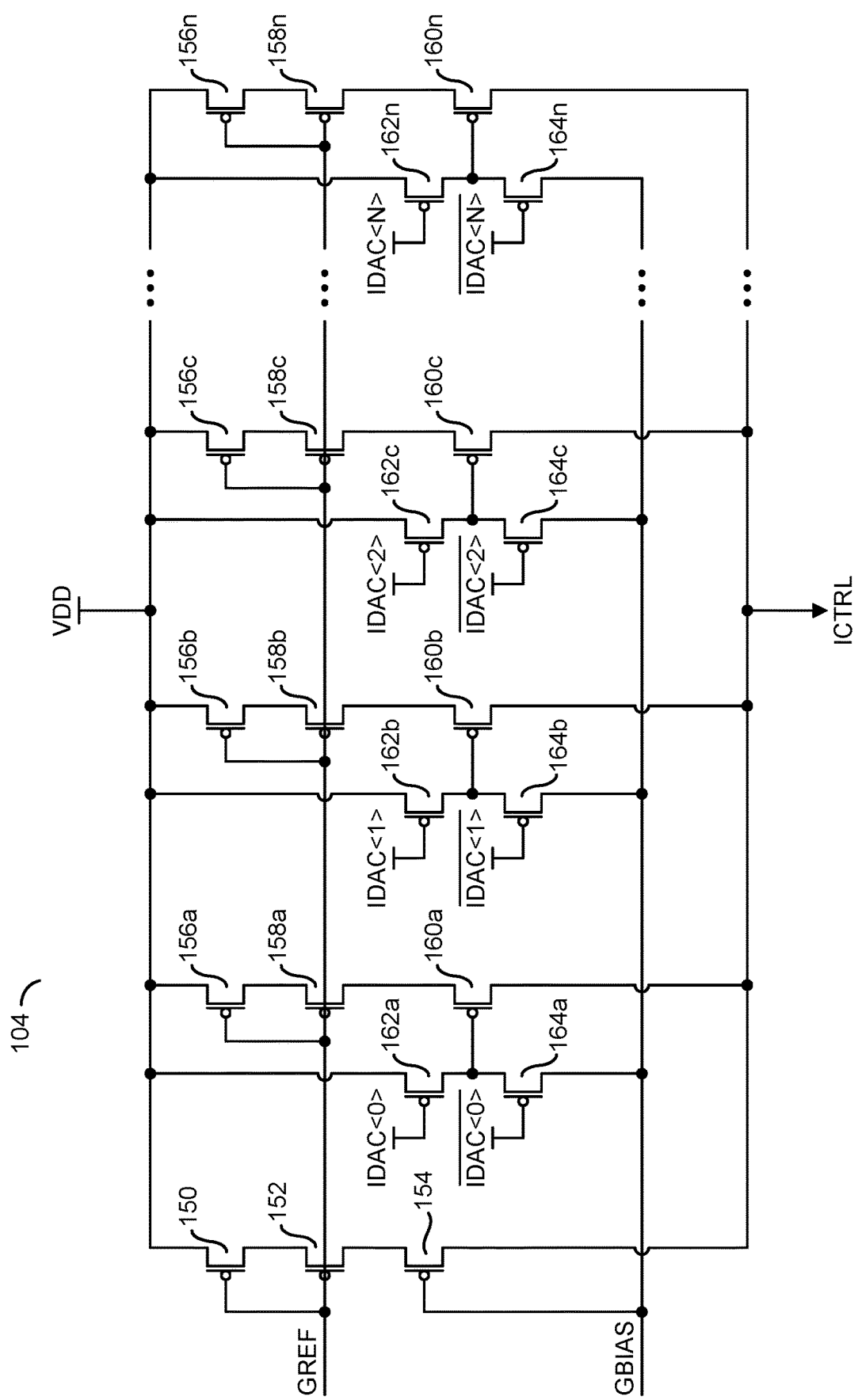
FIG. 5 is a diagram illustrating a current-steering digital-to-analog converter circuit in accordance with an embodiment of the invention.

Referring to FIG. 5, a diagram is shown illustrating an example implementation of the circuit 104 of FIG. 3. In an example, the circuit 104 may be implemented as an n-bit current-steering digital-to-analog converter. In an example, the circuit 104 may be implemented with seven bits to provide a flexible 1:N current ratio. In an example, the circuit 104 may provide the current ICTRL with a current ratio ranging from a minimum value needed to ensure the ring oscillator 68 oscillates (e.g., about 0.354×) to a maximum value of 3× following the control voltage current IREF generated by the circuit 102.

In an example, the circuit 104 may comprise a transistor 150, a transistor 152, a transistor 154, a plurality of binary weighted transistors 156a-156n, a plurality of binary weighted transistors 158a-158n, a plurality of transistors 160a-160n, a plurality of transistors 162a-162n, and a plurality of transistors 164a-164n. In an example, the transistors 150, 152, 154, 156a-156n, 158a-158n, 160a-160n, 162a-162n, and 164a-164n may be implemented as PMOS FETs. In an example, the circuit 104 generally comprises a fixed current stage (e.g., comprising the transistors 150, 152, and 154) and a plurality of binary-weighted current stages (e.g., each comprising respective ones of the transistors 156a-156n, 158a-158n, 160a-160n, 162a-162n, and 164a-164n). Each of the plurality of binary-weighted current stages is generally configured to be controlled by a respective bit of the signal IDAC. In an example, the transistors 156a, 158a, 160a, 162a, and 164a may implement a least significant bit (LSB) stage and the transistors 156n, 158n, 160n, 162n, and 164n may implement a most significant bit (MSB) stage. In an example, the fixed current stage (e.g., comprising the transistors 150, 152, and 154) may be configured (sized) to generate a current that is approximately 0.354 times the control voltage current generated by the circuit 102 and each of the binary-weighted stages may be configured (sized) to generate respective currents which, when added together with the current of the fixed current stage approximately equal 3× the control voltage current generated by the circuit 102. In an example embodiment where the signal IDAC is implemented as a 7-bit signal and the control voltage current source of the circuit 102 is implemented comprising 288 fingers, the current sources of the stages of the circuit 104 may be implemented as summarized as in the following Table 1:

TABLE 1

| STAGE | FINGERS |
| --- | --- |
| Fixed current | 102 |
| IDAC<0> | 6 |
| IDAC<1> | 12 |
| IDAC<2> | 24 |
| IDAC<3> | 48 |
| IDAC<4> | 96 |

TABLE 1-continued

| STAGE | FINGERS |
| --- | --- |
| IDAC<5> | 192 |
| IDAC<6> | 384 |

However, other numbers of fingers may be implemented to meet design criteria of a particular implementation.

In an example, a source terminal of the transistor 150, source terminals of the transistors 156a-156n, and source terminals of the transistors 162a-162n may be connected to the regulated supply voltage VDD. A drain terminal of the transistor 150 may be connected to a source terminal of the transistor 152. A gate terminal of the transistor 150 may be connected to a gate terminal of the transistor 152. A drain terminal of the transistor 152 may be connected to a source terminal of the transistor 154. The signal GBIAS may be presented to a gate terminal of the transistor 154.

A drain terminal of each of the transistors 156a-156n may be connected to a source terminal of a respective one of transistors 158a-158n. A gate terminal of each of the transistors 156a-156n may be connected to a gate terminal of the respective one of transistors 158a-158n. The signal GREF may be presented to the gate terminals of the transistors 150, 152, 156a-156n, and 158a-158n. A drain terminal of each of the transistors 158a-158n may be connected to a source terminal of a respective one of transistors 160a-160n. A source terminal of each of the transistors 154 and 160a-160n may be connected together to form a node at which the signal ICTRL may be presented.

A drain terminal of each of the transistors 162a-162n may be connected to a source terminal of a respective one of transistors 164a-164n and a gate terminal of a respective one of transistors 160a-160n. A drain terminal of each of the transistors 164a-164n may be connected together with the gate terminal of the transistor 154 to form a node to receive the signal GBIAS. A gate terminal of each of the transistors 162a-162n may be connected to receive a respective bit (e.g., IDAC<0>, IDAC<1>, . . . , IDAC<n>) of the signal IDAC. A gate terminal of each of the transistors 164a-164n may be connected to receive a complement of the respective bit (e.g., IDAC<0>, IDAC<1>, . . . , IDAC<n>) of the signal IDAC. The use of the transistors 162a-162n and 164a-164n, and the bias signal GBIAS generally ensure that the transistors 160a-160n may be fully turned ON or fully turned OFF based on the value of the respective bit of the signal IDAC. In an example, a fanout of the signal IDAC may be increased and the complement of the signal IDAC may be generated using a plurality of inverter circuits connected in series.

Figure 6A:
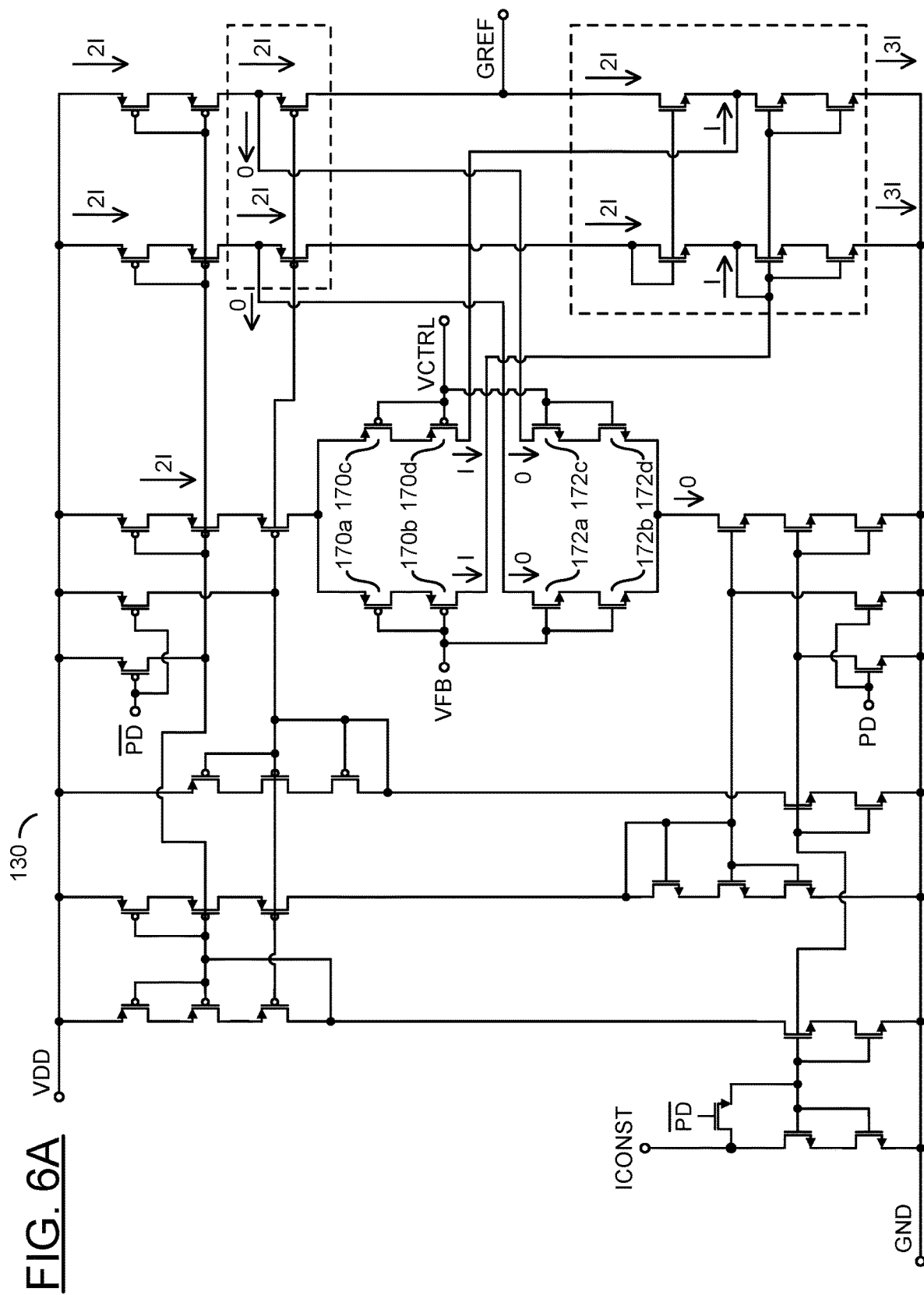
FIGS. 6A-6C are diagrams illustrating operation of an operational transconductance amplifier of a current reference and bias voltage generating circuit in accordance with an embodiment of the invention.
Figure 6B:
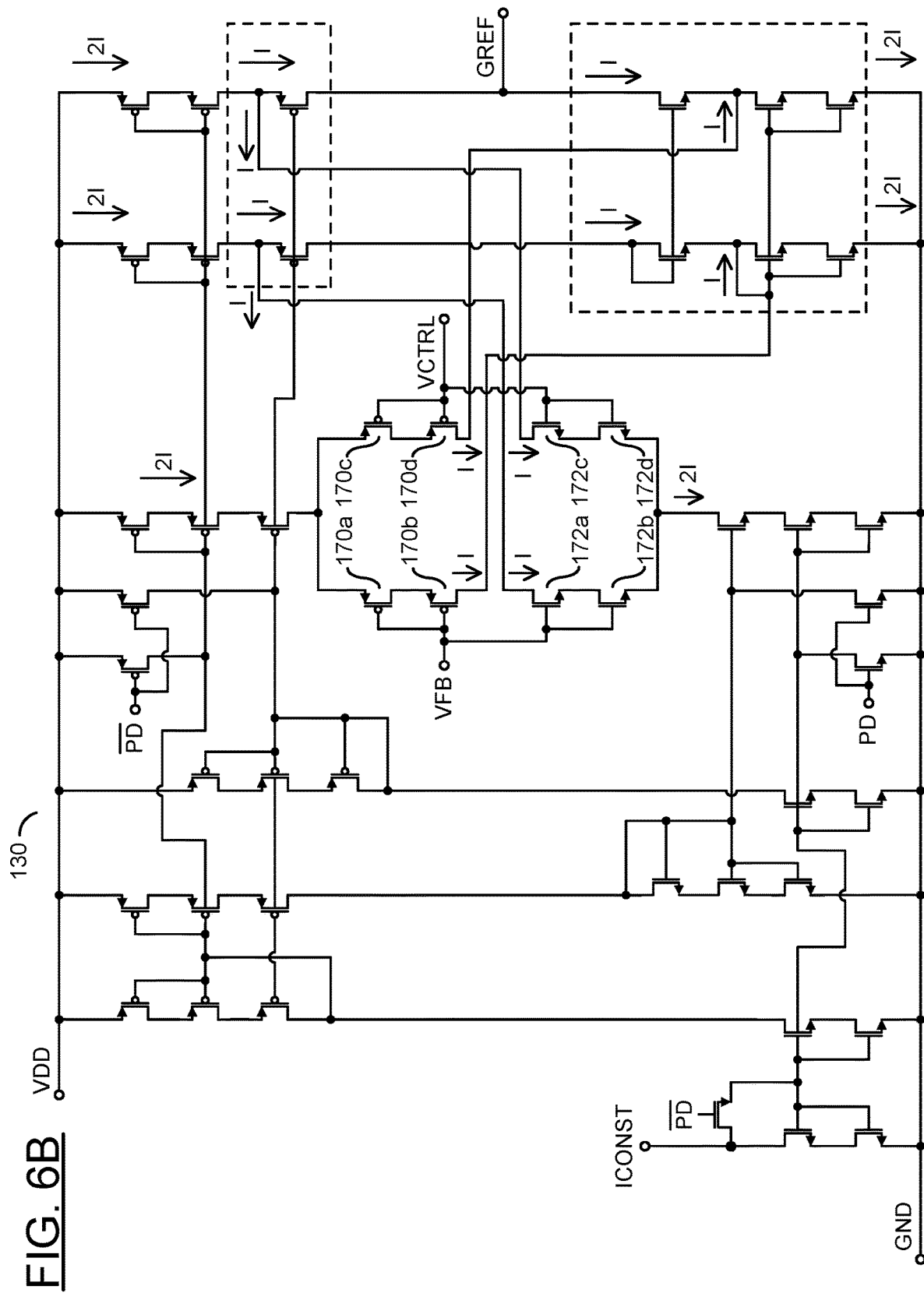
Figure 6C:
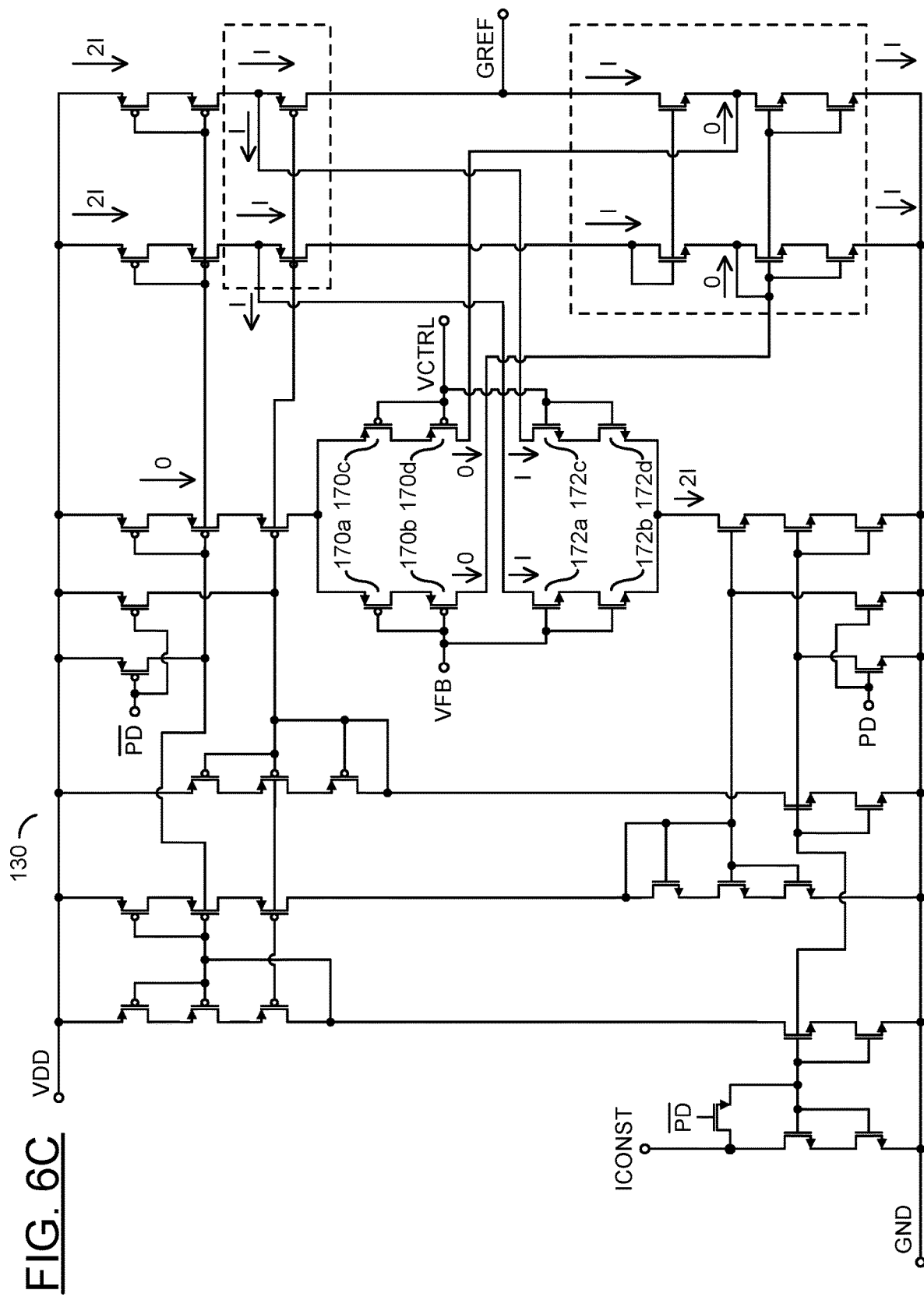

Referring to FIGS. 6A-6C, diagrams of a wide-swing folded cascade operational transconductance amplifier are shown illustrating operation of the circuit 130 in accordance with an embodiment of the invention for various control voltages VCTRL. Bulk terminal connections have been omitted for clarity. Referring to FIG. 6A, a diagram is shown illustrating operation of the operational transconductance amplifier circuit 130 when the control voltage VCTRL is significantly lower than about half of the supply voltage VDD. In an example, an input stage of the operational transconductance amplifier circuit 130 may comprise a plurality of differential PMOS transistors 170a-170d and a plurality of NMOS transistors 172a-172d. In an example, only the input differential PMOS transistors 170a-170d of the operational transconductance amplifier 130 are ON (conducting) when the control voltage VCTRL is signifi-cantly lower than about half of the supply voltage VDD. Referring to FIG. 6B, a diagram is shown illustrating operation of the operational transconductance amplifier circuit 130 when the control voltage VCTRL is approximately equal to half of the supply voltage VDD. In an example, both the input differential PMOS transistors 170a-170d and the input differential NMOS transistors 172a-172d of the operational transconductance amplifier 130 are ON (conducting) when the control voltage VCTRL is approximately equal to half of the supply voltage VDD. Referring to FIG. 6C, a diagram is shown illustrating operation of the operational transconductance amplifier circuit 130 when the control voltage VCTRL is significantly higher than about half of the supply voltage VDD. In an example, only the input differential NMOS transistors 172a-172d of the operational transconductance amplifier 130 are ON (conducting) when the control voltage VCTRL is significantly higher than about half of the supply voltage VDD.

Figure 7:
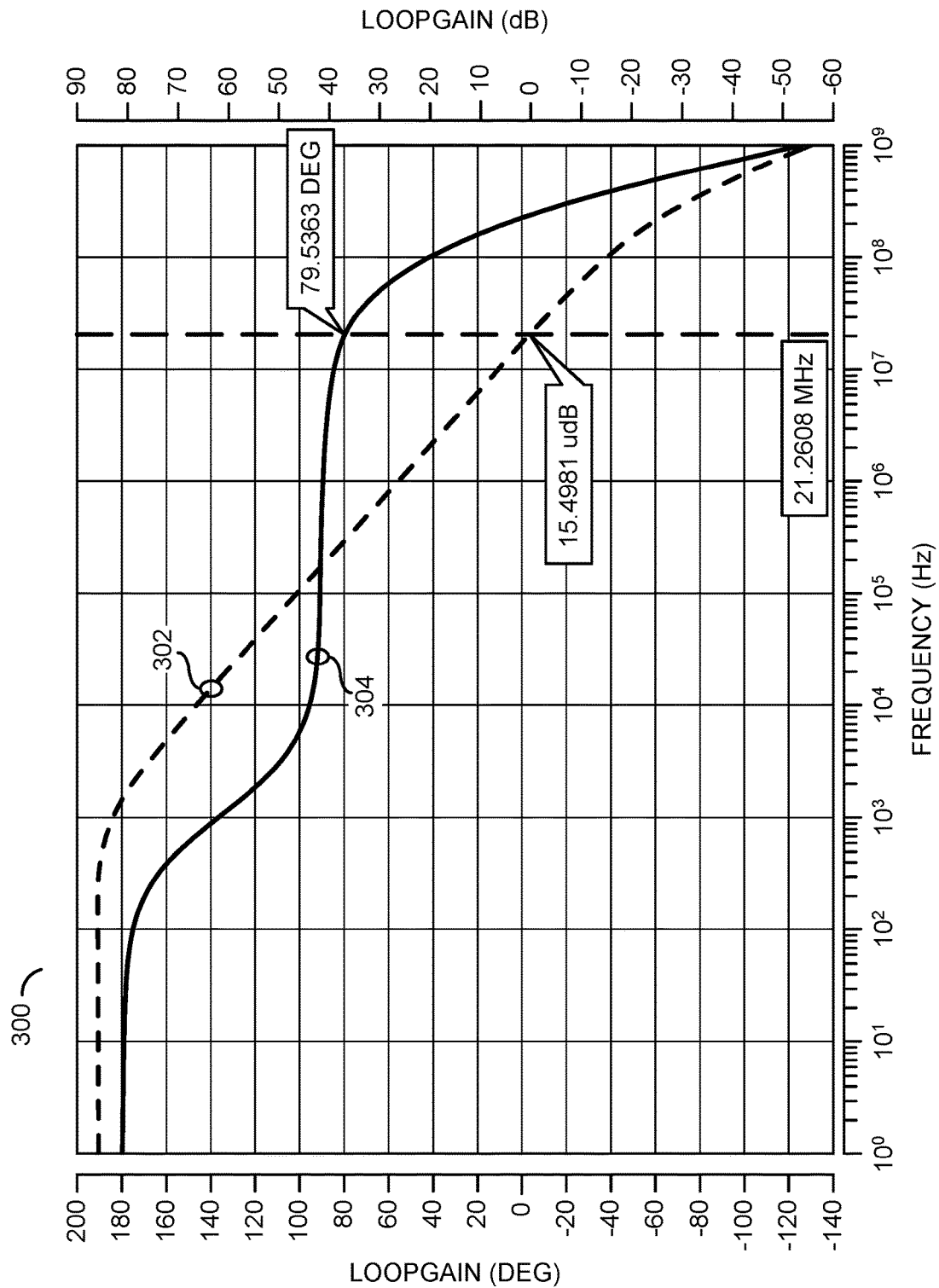
FIGS. 7-9 are diagrams illustrating simulation results for stability of a voltage controlled oscillator in accordance with an embodiment of the invention at different control voltage levels.

Referring to FIG. 7, a diagram of a graph 300 is shown illustrating a simulation result for wide-swing folded cascade OTA stability of a voltage controlled oscillator in accordance with an embodiment of the invention with a value of the control voltage VCTRL of about 0.45 Volt. A curve 302 illustrates loop gain in decibels vs. frequency. A curve 304 illustrates loop gain in degrees vs. frequency. In an example, when the control voltage VCTRL is about 0.45 Volt, the voltage controlled oscillator in accordance with an embodiment of the invention generally has a phase margin greater than 77 degrees and a bandwidth greater than 20 MHZ.

Figure 8:
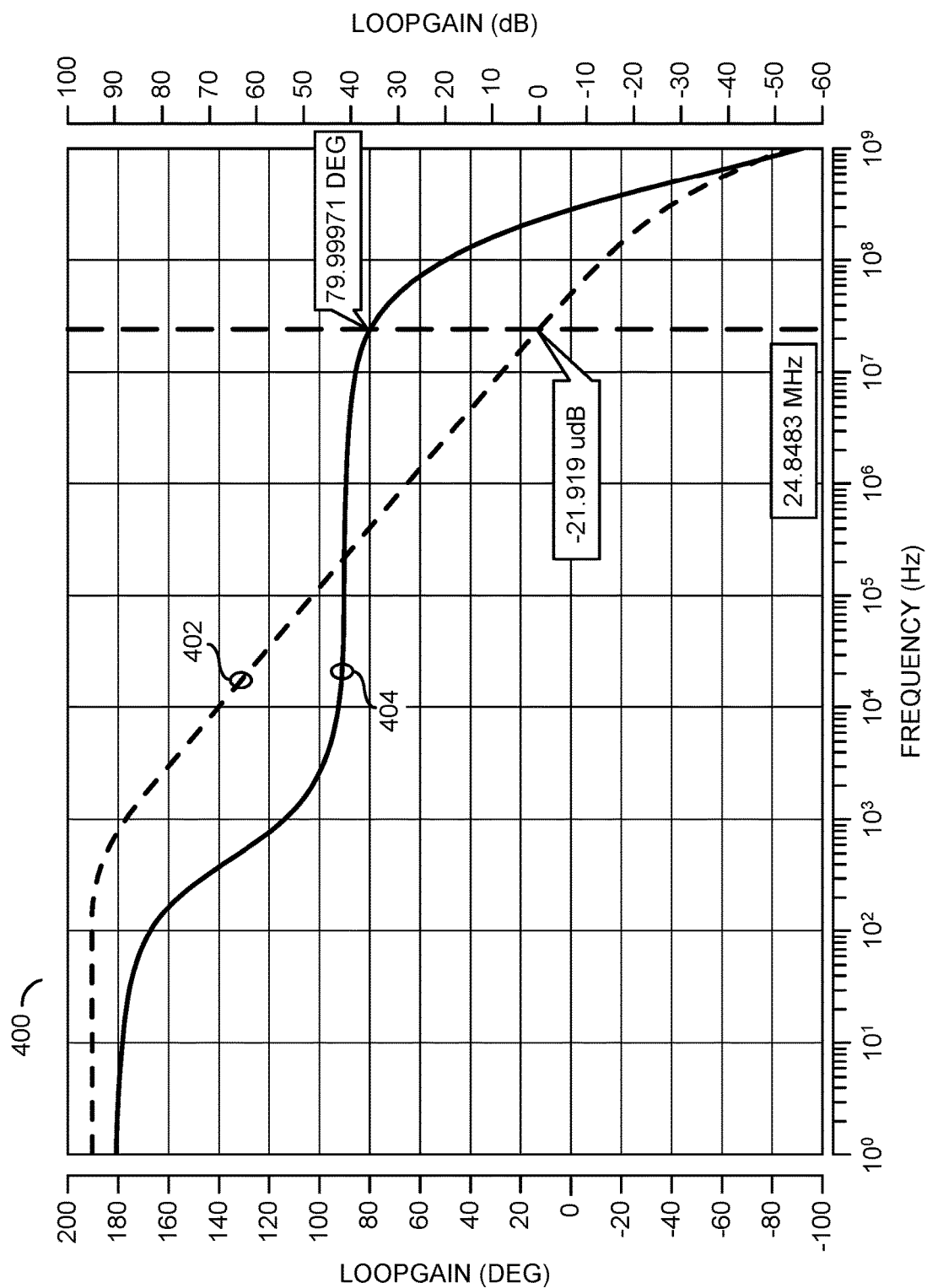

Referring to FIG. 8, a diagram of a graph 400 is shown illustrating a simulation result for wide-swing folded cascade OTA stability of a voltage controlled oscillator in accordance with an embodiment of the invention with a value of the control voltage VCTRL of about half the supply voltage VDD. A curve 402 illustrates loop gain in decibels vs. frequency. A curve 404 illustrates loop gain in degrees vs. frequency. In an example, when the control voltage VCTRL is about half the supply voltage VDD, the voltage controlled oscillator in accordance with an embodiment of the invention may still have a phase margin greater than 77 degrees and a bandwidth greater than 20 MHZ.

Figure 9:
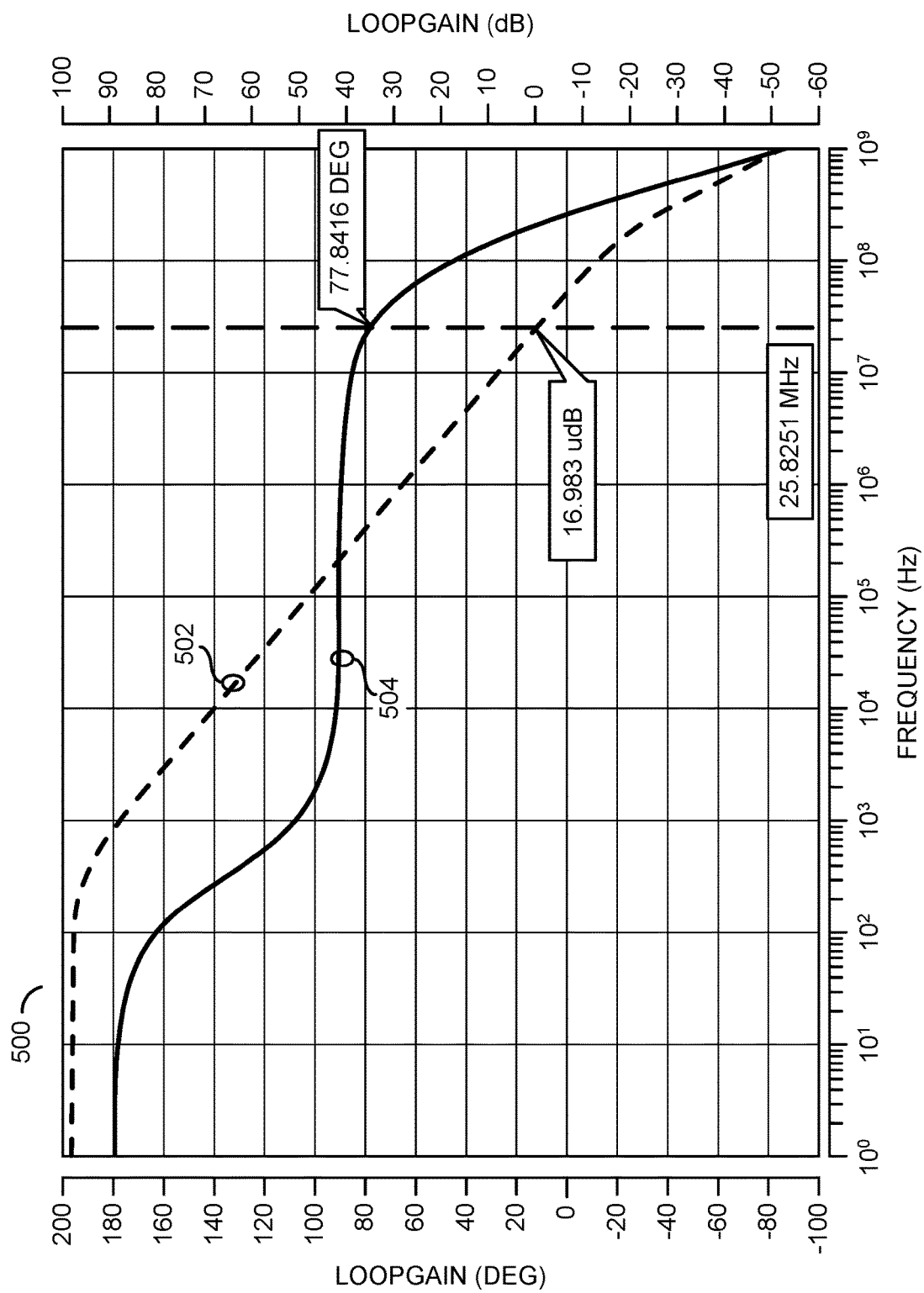

Referring to FIG. 9, a diagram of a graph 500 is shown illustrating a simulation result for wide-swing folded cascade OTA stability of a voltage controlled oscillator in accordance with an embodiment of the invention with a value of the control voltage VCTRL of about 0.8 Volt. A curve 502 illustrates loop gain in decibels vs. frequency. A curve 504 illustrates loop gain in degrees vs. frequency. In an example, when the control voltage VCTRL is about 0.8 Volt, the voltage controlled oscillator in accordance with an embodiment of the invention may still have a phase margin greater than 77 degrees and a bandwidth greater than 20 MHZ.

Figure 10:
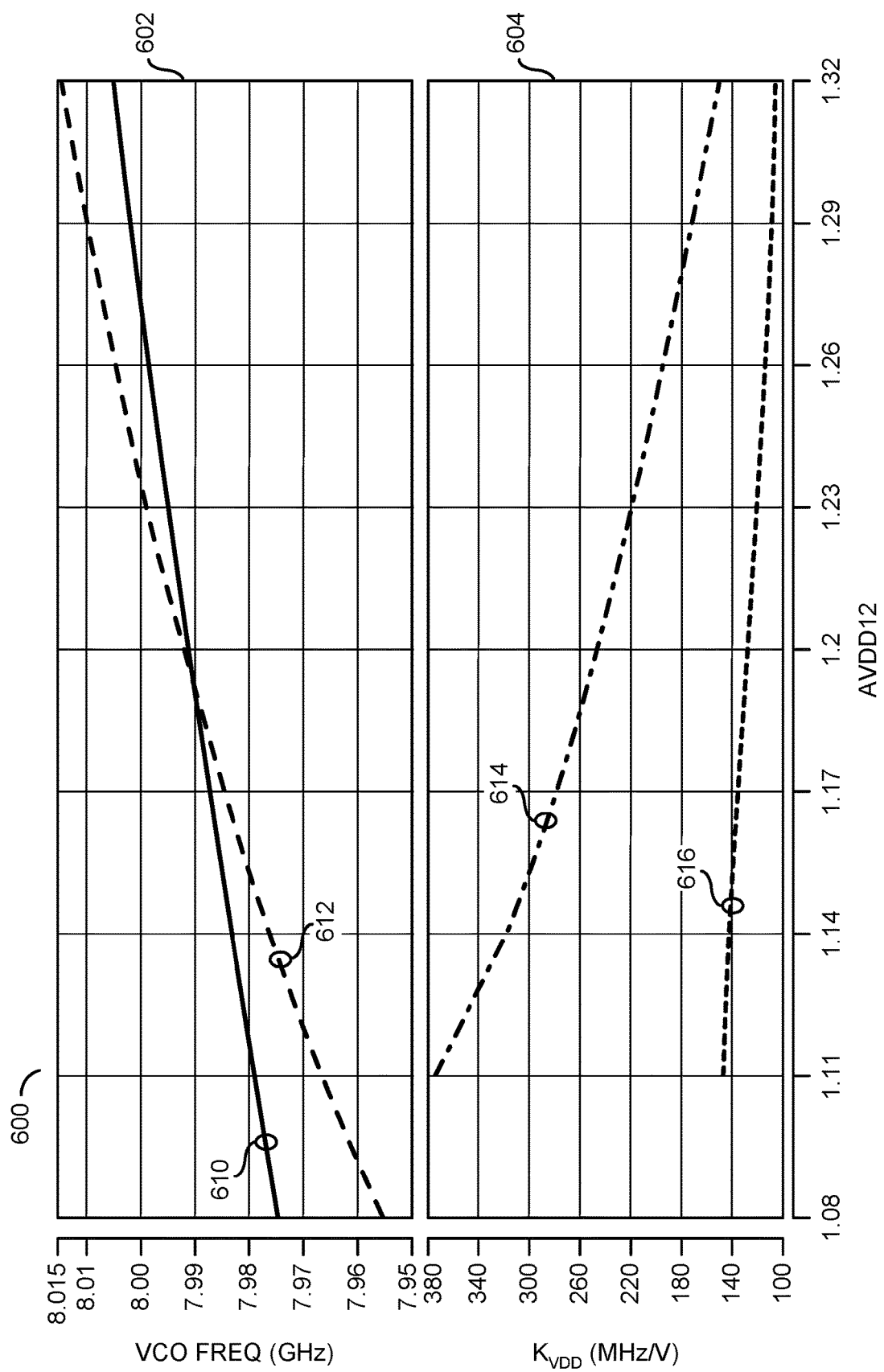
FIG. 10 is a diagram illustrating a simulation result for supply noise rejection of a voltage controlled oscillator in accordance with an embodiment of the invention.

Referring to FIG. 10, a diagram 600 is shown illustrating a simulation result of a supply noise rejection comparison between a current-biased voltage controlled oscillator and an OTA-biased voltage controlled oscillator in accordance with an embodiment of the invention. A graph 602 illustrates a comparison of VCO frequency between a current-biased voltage controlled oscillator and an OTA-biased voltage controlled oscillator in accordance with an embodiment of the invention. A graph 604 illustrates a comparison of VCO frequency versus supply voltage (e.g., $K_{VDD}$=deriv(VCO frequency)) between a current-biased voltage controlled oscillator and an OTA-biased voltage controlled oscillator in accordance with an embodiment of the invention. A curve 610 illustrates the VCO frequency of an OTA-biased voltage controlled oscillator in accordance with an embodiment of the invention over a range of VDD from 1.08V to 1.32V. A curve 612 illustrates the VCO frequency of a current-biased voltage controlled oscillator over the range of VDD from 1.08V to 1.32V. As may be seen in the graph 604, frequency variation due to supply noise in the OTA-biased voltage controlled oscillator is reduced in half from the frequency variation due to supply noise in the current-biased voltage controlled oscillator. A curve 614 illustrates a rate of change in frequency due to supply noise of the current-biased voltage controlled oscillator varies from about 374.5 MHz/V to 151 MHZ/V over the range of VDD from 1.08V to 1.32V. A curve 616 illustrates a rate of change in frequency due to supply noise of the OTA-biased voltage controlled oscillator in accordance with an embodiment of the invention is lower (e.g., varying from about 146.7 MHz/V to 106.5 MHZ/V over the range of VDD from 1.08V to 1.32V) than the rate of change in frequency due to supply noise of the current-biased voltage controlled oscillator.

Figure 11:
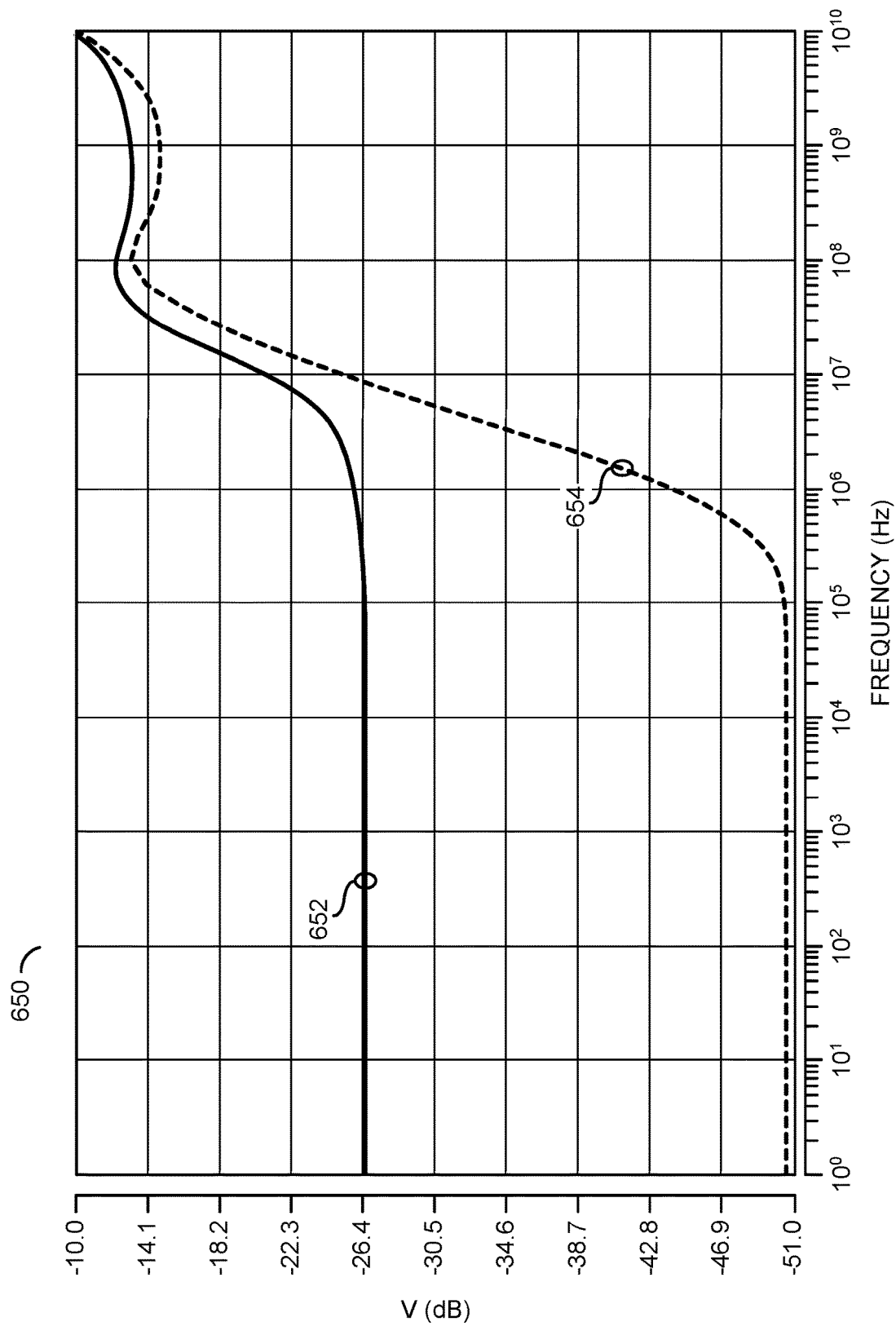
FIG. 11 is a diagram illustrating a comparison of simulations of supply noise rejection between a current-biased voltage controlled oscillator and an OTA-biased voltage controlled oscillator in accordance with an embodiment of the invention.

Referring to FIG. 11, a diagram 650 is shown illustrating a comparison of AC simulations for supply noise rejection between a current-biased voltage controlled oscillator and an OTA-biased voltage controlled oscillator in accordance with an embodiment of the invention. The AC simulation checks power supply rejection at the current control terminal of the ring oscillator 68 where the signal ICTRL is presented. In the diagram 650, a simulation is shown where the ring oscillator 68 is replaced by a resistance emulating voltage (0.8V) and current (3 mA) for the current control terminal of the ring oscillator 68 at 8 GHz at the worst corner and AC noise of about 1V is applied on the supply voltage VDD. A curve 652 generally illustrates supply noise rejection for a current-biased voltage controlled oscillator. A curve 654 generally illustrates supply noise rejection for an OTA-biased voltage controlled oscillator in accordance with an embodiment of the invention. When supply noise less than or equal to the loop bandwidth of the OTA 130 (e.g., 20 MHz) is applied, the supply noise rejection of the OTA-biased voltage controlled oscillator in accordance with an embodiment of the invention is substantially better than the supply noise rejection of the current-biased voltage controlled oscillator (e.g., ~25 dB). When supply noise greater than the loop bandwidth of the OTA 130 (e.g., >20 MHz) is applied, the supply noise rejection of the OTA-biased voltage controlled oscillator in accordance with an embodiment of the invention is still better than the supply noise rejection of the current-biased voltage controlled oscillator (e.g., ~2 dB).

Figure 12:
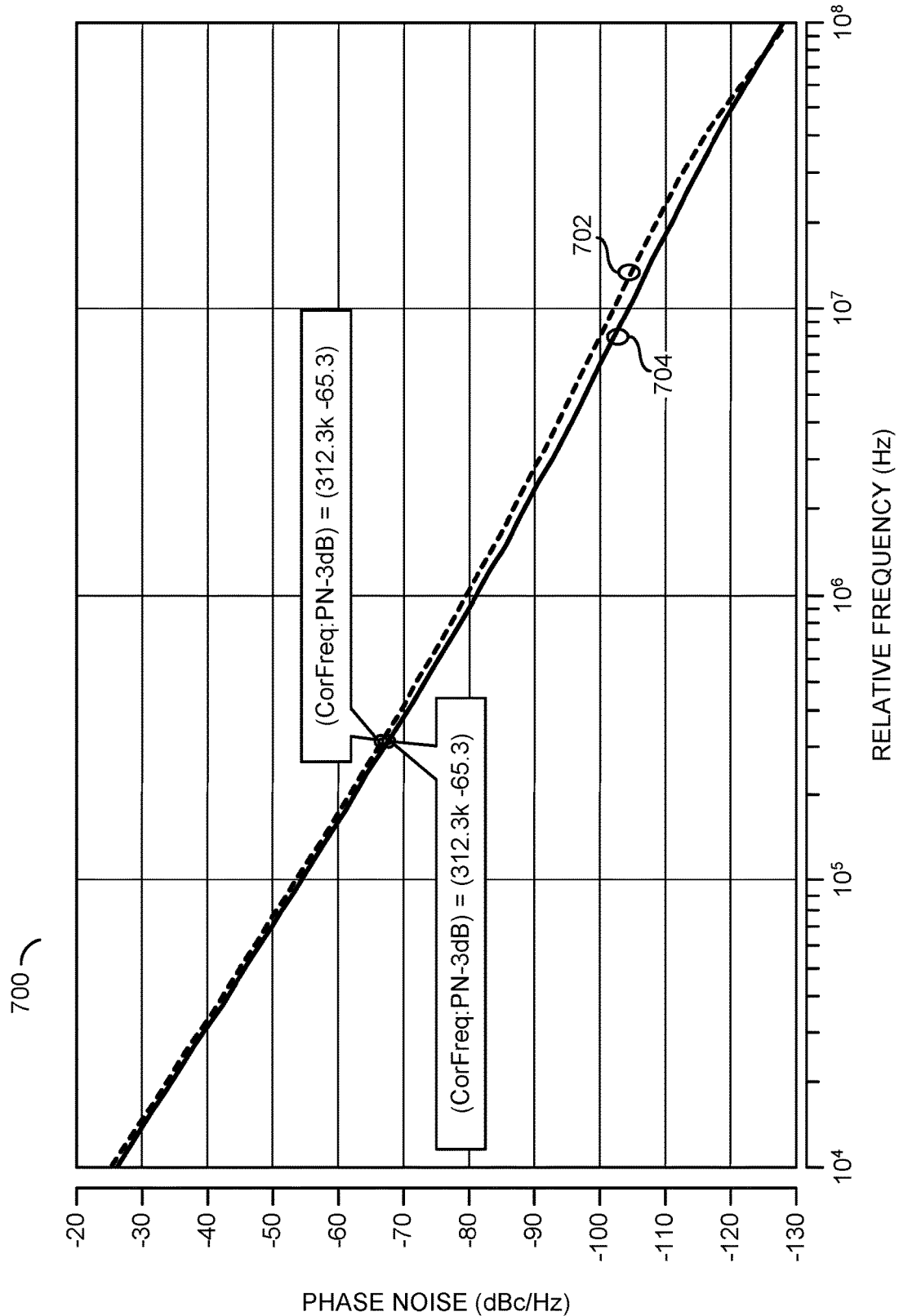
FIG. 12 is a diagram illustrating a comparison of phase noise simulations between a current-biased voltage controlled oscillator and an OTA-biased voltage controlled oscillator in accordance with an embodiment of the invention.

Referring to FIG. 12, a diagram 700 is shown illustrating a comparison of simulations for phase noise from device flicker and thermal noise between a current-biased voltage controlled oscillator and an OTA-biased voltage controlled oscillator in accordance with an embodiment of the invention. A curve 702 generally illustrates phase noise from device flicker and thermal noise for an OTA-biased voltage controlled oscillator in accordance with an embodiment of the invention. A curve 704 generally illustrates phase noise from device flicker and thermal noise for a current-biased voltage controlled oscillator. The phase noise from device flicker and thermal noise for an OTA-biased voltage controlled oscillator in accordance with an embodiment of the invention is comparable to the phase noise from device flicker and thermal noise for a current-biased voltage controlled oscillator, but the frequency variation due to supply noise is reduced by half. In general, total jitter (time domain) is the sum of deterministic jitter (DJ, from supply and substrate noise, jitter in reference signal, etc.) and random jitter (RJ, from device flicker and thermal noise). Thus, the total jitter in an OTA-biased voltage controlled oscillator in accordance with an embodiment of the invention should be less than in the current-biased voltage controlled oscillator.

Figure 13:
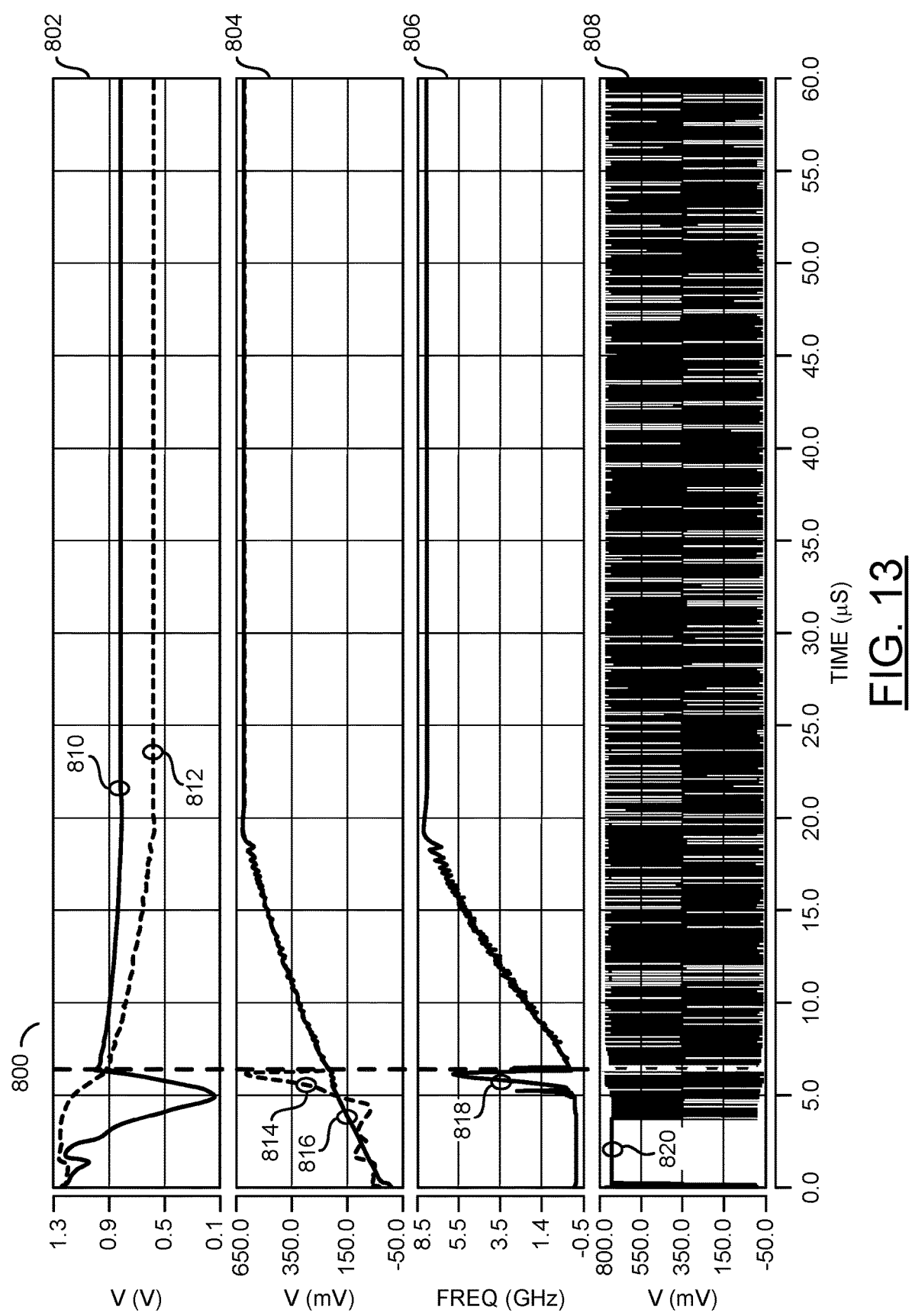
FIG. 13 is a diagram illustrating a simulation result of a phase-locked loop utilizing a voltage controlled oscillator in accordance with an embodiment of the invention.

Referring to FIG. 13, a diagram 800 is shown illustrating simulation results of a PLL implementing an OTA-biased voltage controlled oscillator in accordance with an embodiment of the invention. A graph 802 illustrates voltage levels of the signals GREF and GBIAS during a startup period. A graph 804 illustrates voltages levels of the signals VCTRL and VFB during the startup period. A graph 806 illustrates variation in the frequency Fvco of the output signal OUT during the startup period. A graph 808 illustrates a voltage level of the signal OUT. A curve 810 illustrates the signal GREF. A curve 812 illustrates the signal GBIAS. A curve 814 illustrates the signal VFB. A curve 816 illustrates the signal VCTRL. A curve 818 illustrates the frequency Fvco of the output signal OUT during the startup period. The OTA 130 initially operates open loop (e.g., during a period between the left side of the graphs and a dashed line) to pull down the signal GREF to provide a large amount of current to start the VCO 60 oscillating. The OTA 130 then switches (e.g., at the time corresponding with the dashed line) to closed loop operation, the signal VFB begins tracking the signal VCTRL and the frequency Fvco of the output signal OUT stabilizes to a predetermined value.

The functions performed by the diagrams of FIGS. 1-12 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The various signals of the present invention are generally "asserted" (e.g., a digital HIGH, or 1) or "un-asserted" (e.g., a digital LOW, or 0). However, the particular polarities of the asserted (e.g., on) and un-asserted (e.g., off) states of the signals may be adjusted (e.g., reversed) to meet the design criteria of a particular implementation. Additionally, inverters may be added to change a particular polarity of the signals.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
   a first circuit configured to generate a reference signal and a bias signal in response to a supply voltage and a first input signal, wherein said first circuit provides supply noise rejection to variations in said supply voltage;
   a second circuit connected to said first circuit and a ring oscillator;
   a first transistor connected to said first circuit and configured to set a first reference current of said first circuit based on said first input signal and a first programmable resistance;
   a second transistor connected in parallel with said first transistor, wherein said second transistor is diode-connected; and
   a third transistor connected to said first circuit and configured to set a second reference current of said first circuit based on said first input signal and a second programmable resistance, wherein
   said first circuit forms a current mirror with said second circuit, and
   said second circuit is configured to provide a programmable current ratio for said current mirror based on a value of a second input signal.

2. The apparatus according to claim 1, wherein said first circuit, said second circuit, and said ring oscillator are configured as a voltage controlled oscillator configured to generate an output signal in response to a voltage level of said first input signal and said value of said second input signal.

3. The apparatus according to claim 2, wherein said first circuit and said second circuit are implemented as components of a phase-locked loop.

4. The apparatus according to claim 2, said voltage level of said first input signal is configured to set a first current in said first transistor and a second current in said third transistor, and said second current is a fraction of said first current.

5. The apparatus according to claim 1, wherein said first circuit comprises an operational transconductance amplifier configured to generate said reference signal in response to said first input signal and said first reference current.

6. The apparatus according to claim 5, further comprising a bypass capacitor connected between an output terminal of said operational transconductance amplifier and said supply voltage.

7. The apparatus according to claim 1, wherein said first circuit comprises a plurality of transistors connected in series and configured to generate said bias signal in response to said reference signal, said first reference current, and said second reference current.

8. The apparatus according to claim 7, wherein each of said plurality of transistors comprise one or more p-channel metal-oxide-semiconductor field effect transistors.

9. The apparatus according to claim 1, wherein each of said first transistor, said second transistor, and said third transistor comprises one or more n-channel metal-oxide-semiconductor field effect transistors.

10. The apparatus according to claim 1, wherein said first programmable resistance is programmed in response to a value of a third input signal.

11. The apparatus according to claim 10, wherein said third input signal comprises a plurality of binary bits.

12. The apparatus according to claim 10, wherein said second programmable resistance is programmed in response to said value of said third input signal.

13. The apparatus according to claim 12, wherein said second programmable resistance is a fraction of said first programmable resistance.

14. The apparatus according to claim 1, wherein said first transistor comprises a first channel width, said second transistor comprises a second channel width, and said third transistor comprises a third channel width.

15. The apparatus according to claim 14, wherein said first channel width and said second channel width are substantially equal and said third channel width is a fraction of a sum of said first channel width and said second channel width.

16. The apparatus according to claim 15, wherein (i) a first ratio of said third channel width to the sum of said first channel width and said second channel width and (ii) a second ratio of said second programmable resistance to said first programmable resistance are substantially equal.

17. A method of providing supply noise rejection in a voltage controlled oscillator circuit comprising:
  generating a reference signal and a bias signal in response to a supply voltage, a first input signal, a first reference current, and a second reference current, wherein said reference signal and said bias signal compensate for variations in said supply voltage;
  generating said first reference current based on said first input signal using a first transistor connected in series with a first programmable resistance and a second transistor connected in parallel with said first transistor, wherein said second transistor is diode-connected;
  generating said second reference current based on said first input signal using a third transistor connected in series with a second programmable resistance; and
  generating a control current of an oscillator circuit of said voltage controlled oscillator circuit in response to said supply voltage, said reference signal, and said bias signal using a voltage controlled current source, wherein said voltage controlled current source is configured to provide a programmable current ratio between said control current and said first reference current based on a value of a second input signal.

18. The method according to claim 17, wherein:
  said oscillator circuit comprises a ring oscillator; and
  said voltage controlled oscillator circuit is configured to generate an output signal in response to a voltage level of said first input signal and said value of said second input signal.

19. The method according to claim 17, wherein each of said first transistor, said second transistor, and said third transistor comprises one or more n-channel metal-oxide-semiconductor field effect transistors.

20. The method according to claim 17, wherein a first ratio of said second programmable resistance to said first programmable resistance and a second ratio of a combined channel width of said first transistor and said second transistor to a channel width of said third transistor are substantially equal.

* * * * *